US012784855B2

(12) United States Patent
Peng

(10) Patent No.: US 12,784,855 B2
(45) Date of Patent: Nov. 3, 2026

(54) TESTING METHOD AND MEMORY MODULE UNDER TEST

(71) Applicant: NANYA TECHNOLOGY CORPORATION, New Taipei City (TW)

(72) Inventor: Bo Jung Peng, New Taipei City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 143 days.

(21) Appl. No.: 19/019,412

(22) Filed: Jan. 13, 2025

(65) Prior Publication Data

US 2025/0157557 A1 May 15, 2025

Related U.S. Application Data

(63) Continuation of application No. 18/055,422, filed on Nov. 15, 2022, now Pat. No. 12,237,029.

(51) Int. Cl.
*G11C 29/10* (2006.01)
*G01R 31/28* (2006.01)
*G01R 31/317* (2006.01)

(52) U.S. Cl.
CPC .......... *G11C 29/10* (2013.01); *G01R 31/2837* (2013.01); *G01R 31/31725* (2013.01)

(58) Field of Classification Search
CPC ... G11C 29/10; G11C 29/50; G11C 29/50016; G11C 29/08; G11C 29/36; G01R 31/2837; G01R 31/31725
See application file for complete search history.

(56) References Cited

U.S. PATENT DOCUMENTS

| | | | |
|---|---|---|---|
| 5,703,823 | A | 12/1997 | Douse et al. |
| 2003/0227307 | A1 | 12/2003 | Le et al. |
| 2022/0406394 | A1 | 12/2022 | Wang |

*Primary Examiner* — Mark D Featherstone
*Assistant Examiner* — Rong Tang
(74) *Attorney, Agent, or Firm* — CKC & Partners Co., LLC

(57) ABSTRACT

A testing method includes the following steps of: inputting a first signal to a memory chip; putting the memory chip into a self-refresh mode according to the first signal; inputting an active command to test the memory chip so as to generate a first testing result according to the first signal; adjusting a bandwidth of the first signal to generate a second signal so as to input to the memory chip; putting the memory chip into the self-refresh mode according to the second signal; inputting the active command to test the memory chip so as to generate a second testing result according to the second signal; and calculating a self-refresh rate of the memory chip according to the first testing result and the second testing result.

15 Claims, 4 Drawing Sheets

TESTING METHOD AND MEMORY MODULE UNDER TEST

CROSS-REFERENCE TO RELATED APPLICATION

This application is a Continuation Application of U.S. application Ser. No. 18/055,422, filed on Nov. 15, 2022, which is herein incorporated by reference in its entirety.

BACKGROUND

Field of Invention

The present disclosure relates to a method and an electronic system. More particularly, the present disclosure relates to a testing method and a testing system.

Description of Related Art

Testers use retention methods to test a self-refresh of a memory. A process of testing a self-refresh rate of a memory is usually in a high temperature range and takes a lot of time cost.

For the foregoing reason, there is a need to provide some testing method to solve the problems of the prior art.

SUMMARY

One aspect of the present disclosure provides a testing method. The testing method includes the following steps of: entering a self-refresh mode respectively in each of a plurality of stages according to each of a plurality of self-refresh commands by a memory chip; receiving a first clock enable signal and a first active command in response to a first level of the first clock enable signal to generate a first testing result at a first stage of the stages by the memory chip; receiving each of a plurality of second clock enable signals and a second active command in response to the first level of each of the second clock enable signals respectively to generate a second testing result at each of second stages of the stages by the memory chip, wherein a duration time of a second level of the first clock enable signal is smaller than a duration time of the second level of each of the second clock enable signals, wherein each of the first testing result and the second testing results indicates a data state of the memory chip; and calculating a self-refresh rate according to the first testing result and the second testing results by an external system.

Another aspect of the present disclosure provides a memory module under test. The memory module under test includes a memory chip. The memory module under test is coupled to an external system. The memory module under test is configured to execute operations: entering a self-refresh mode respectively in each of a plurality of stages according to each of a plurality of self-refresh commands by the memory chip; receiving a first clock enable signal and a first active command in response to a first level of the first clock enable signal to generate a first testing result at a first stage of the stages by the memory chip; receiving each of a plurality of second clock enable signals and a second active command in response to the first level of each of the second clock enable signals respectively to generate a second testing result at each of second stages of the stages by the memory chip, wherein a duration time of a second level of the first clock enable signal is smaller than a duration time of the second level of each of the second clock enable signals, wherein each of the first testing result and the second testing results indicates a data state of the memory chip; and calculating a self-refresh rate according to the first testing result and the second testing results by the external system.

These and other aspects of the present disclosure will become apparent from the following description of the preferred embodiment taken in conjunction with the following drawings, although variations and modifications therein may be effected without departing from the spirit and scope of the novel concepts of the disclosure.

It is to be understood that both the foregoing general description and the following detailed description are by examples, and are intended to provide further explanation of the present disclosure as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
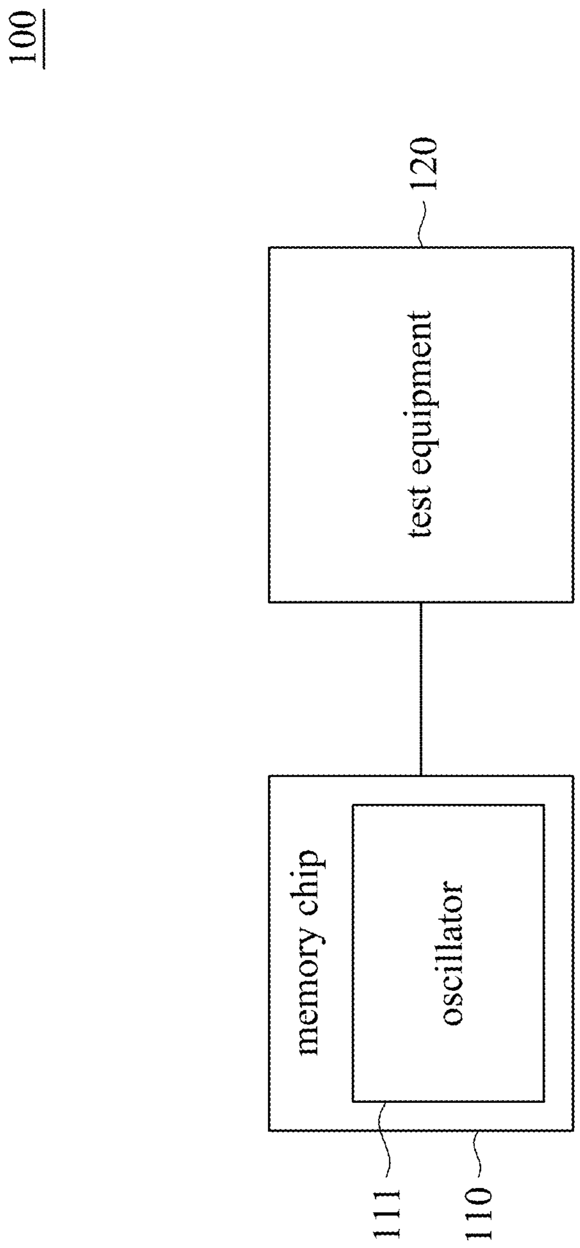
FIG. 1 depicts a schematic diagram of a testing system according to one embodiment of the present disclosure.

Reference will now be made in detail to the present embodiments of the invention, examples of which are illustrated in the accompanying drawings. Wherever possible, the same reference numbers are used in the drawings and the description to refer to the same or like parts.

FIG. 1 depicts a schematic diagram of a testing system 100 according to one embodiment of the present disclosure. In some embodiments, please refer to FIG. 1, the testing system 100 includes a memory chip 110 and a test equipment 120. In some embodiments, the test equipment 120 is coupled to the memory chip 110.

In some embodiments, the test equipment 120 is configured to generate a first signal and an active command. The test equipment 120 is configured to input the first signal to a memory chip. The test equipment 120 is configured to put the memory chip 110 into a self-refresh mode according to the first signal. The test equipment 120 is configured to input the active command to test the memory chip 110 so as to generate a first testing result according to the first signal.

Then, the test equipment 120 is configured to adjust a bandwidth of the first signal to generate a second signal so as to input to the memory chip 110. The test equipment 120 is configured to put the memory chip 110 into the self-refresh mode according to the second signal. The test equipment 120 is configured to input the active command to test the memory chip 110 so as to generate a second testing result according to the second signal. The test equipment 120 is configured to calculate a self-refresh rate of the memory chip 110 according to the first testing result and the second testing result.

In some embodiments, the memory chip 110 includes a double data rate (DDR) synchronous dynamic random access memory (SDRAM).

In some embodiments, each of the first signal and the second signal includes a clock enable signal (CKE signal).

In some embodiments, the memory chip 110 includes an oscillator 111. The oscillator 111 is configured to observe a data state of data stored in the memory chip 110 when the memory chip 110 receives the active command.

Figure 2:
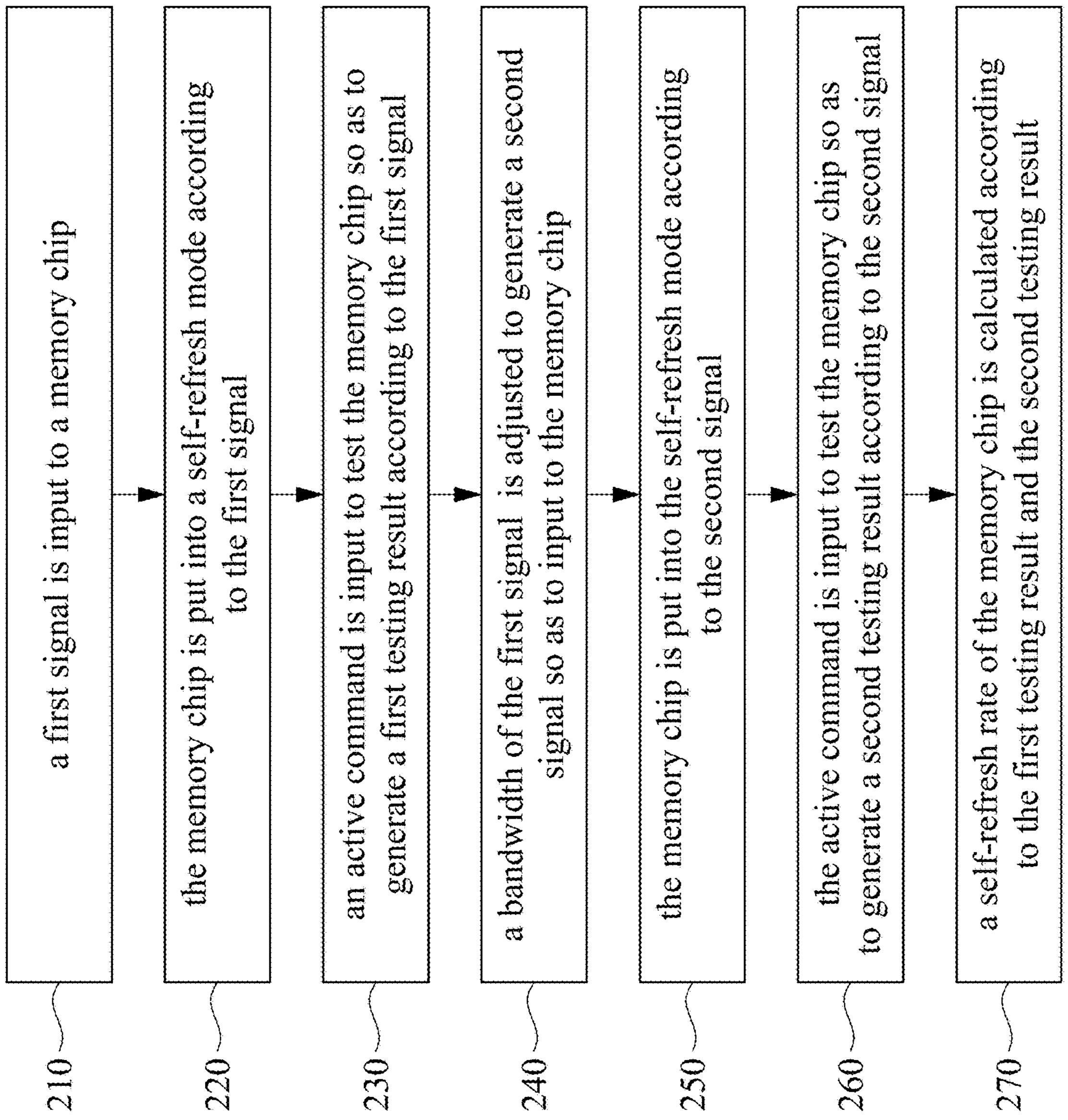
FIG. 2 depicts a flow chart of a testing method according to one embodiment of the present disclosure.
Figure 3:
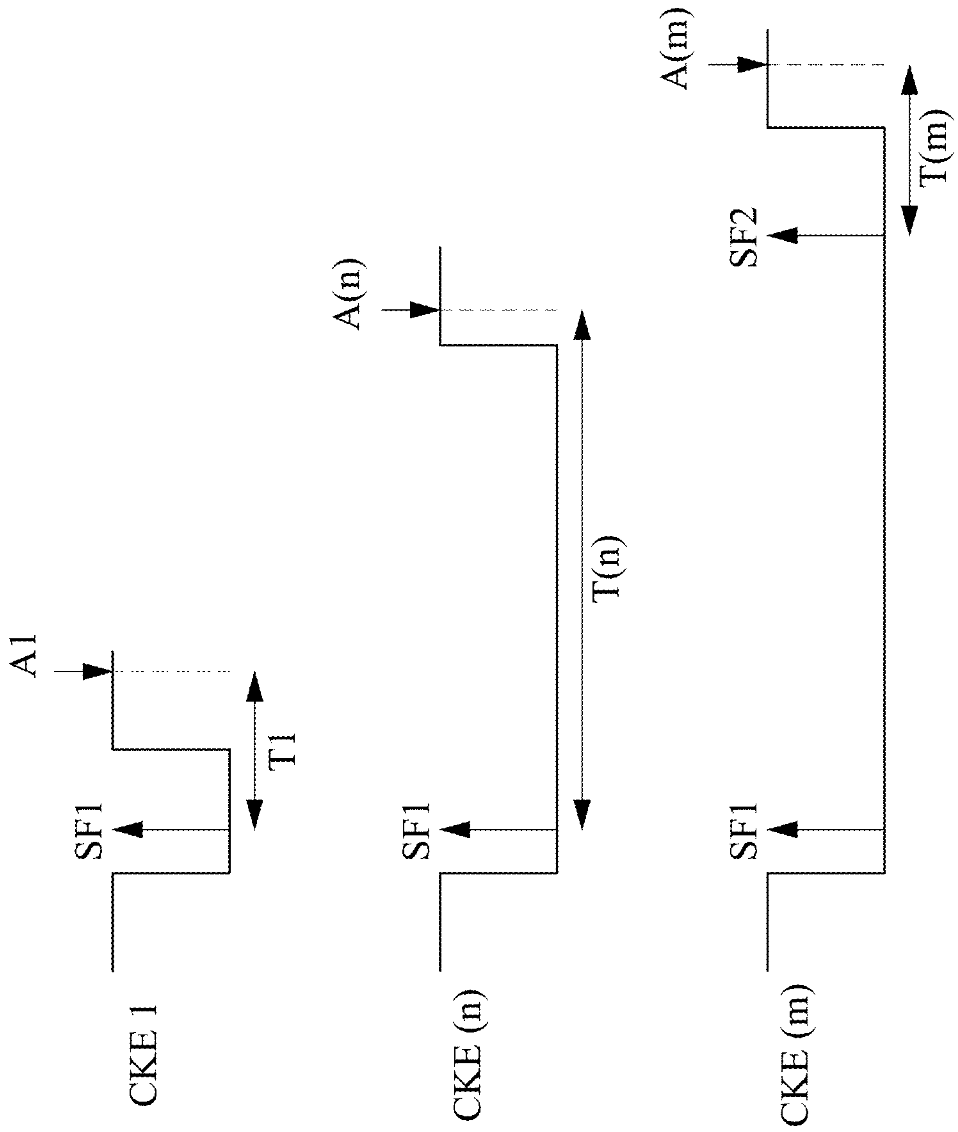
FIG. 3 depicts a schematic diagram of signal adjustment of signals of a testing system according to one embodiment of the present disclosure.

In some embodiments, in order to facilitate the understanding of a testing system 100 shown in FIG. 1. Please refer to FIG. 1 to FIG. 4B. FIG. 2 depicts a flow chart of a testing method 200 according to one embodiment of the present disclosure. FIG. 3 depicts a schematic diagram of signal adjustment of signals of a testing system 100 according to one embodiment of the present disclosure. In some embodiments, the testing method 200 for includes step 210 to step 270, which will be described as shown below.

In step 210, a first signal is input to a memory chip. In some embodiments, please refer to FIG. 1 to FIG. 3, a first signal CKE1 is input to a memory chip 110 by the test equipment 120 of the testing system 100.

In step 220, the memory chip is put into a self-refresh mode according to the first signal. In some embodiments, please refer to FIG. 1 to FIG. 3, the memory chip 110 is put into a self-refresh mode according to the first signal CKE1.

In some embodiments, the memory chip 110 is configured to generate a first self-refresh command SF1 to enter a first self-refresh procedure under the self-refresh mode when a first voltage level of the first signal CKE1 is at a low electrical potential.

In step 230, an active command is input to test the memory chip so as to generate a first testing result according to the first signal. In some embodiments, please refer to FIG. 1 to FIG. 3, an active command A1 is input to test the memory chip 110 so as to generate a first testing result according to the first signal CKE1. It should be noted that a time of the active command A1 must be when the first signal CKE1 is at a high electrical potential.

In some embodiments, a first time difference T1 is formed between the first self-refresh command SF1 and the active command A1.

Then, if the first time difference T1 is less than a refresh cycle time (tRFC) of the memory chip 110, the first testing result is that the memory chip 110 is in a data failure state. In some embodiments, the first time difference T1 also needed to be greater than a minimum time (tXPmin) to leave a power down mode of the of the memory chip 110.

Furthermore, if the first time difference T1 is greater than the refresh cycle time (tRFC) of the memory chip 110, the first testing result is that the memory chip 110 is in a data pass state.

In step 240, a bandwidth of the first signal is adjusted to generate a second signal so as to input to the memory chip. In some embodiments, please refer to FIG. 1 to FIG. 3, a bandwidth of the first signal CKE1 is adjusted to generate a second signal (e.g. a first clock enable signal CKE(n) or a second clock enable signal CKE(m)) so as to input to the memory chip 110 by the test equipment 120 of the testing system 100. It should be noted that each of n and m is a positive integer and m is greater than n.

In some embodiments, the bandwidth of the first signal CKE1 is adjusted to generate the second signals (e.g. the first clock enable signal CKE(n) and the second clock enable signal CKE(m)) one thousand times. In other words, step 240 is repeated one thousand times. It should be noted that each of adjusted bandwidths of the second signals (e.g. the first clock enable signal CKE(n) and the second clock enable signal CKE(m)) is different each time.

In step 250, the memory chip is put into the self-refresh mode according to the second signal. In some embodiments, please refer to FIG. 1 to FIG. 3, the memory chip 110 is put into the self-refresh mode according to the second signal (e.g. the first clock enable signal CKE(n) and the second clock enable signal CKE(m)) by the test equipment 120 of the testing system 100. In some embodiments, following the aforementioned step 240, step 250 can be repeated one thousand times.

In some embodiments, a time difference T(n) is formed between the first self-refresh command SF1 and the active command A(n). It should be noted that a time of the active command A(n) must be when the first clock enable signal CKE(n) is at a high electrical potential.

In some embodiments, please refer to FIG. 1 to FIG. 3, the time difference T(n) is greater than the refresh cycle time (tRFC) of the memory chip 110, the testing result is that the memory chip 110 is in the data pass state.

In step 260, the active command is input to test the memory chip so as to generate a second testing result according to the second signal. In some embodiments, the active command T(n) is input to test the memory chip 110 so as to generate a second testing result according to the second signal (e.g. the second clock enable signal CKE(m)). In some embodiments, following the aforementioned step 240 and step 250, step 260 can be repeated one thousand times.

In some embodiments, when the bandwidth of the first signal CKE(1) is adjusted to second clock enable signal CKE(m) the test equipment 120 of the testing system 100, the memory chip 110 is configured to generate a second self-refresh command SF2 to enter a second self-refresh procedure under the self-refresh mode when a second voltage level of the second signal (e.g. the second clock enable signal CKE(m)) is at a low electrical potential.

In some embodiments, please refer to FIG. 1 to FIG. 3, a second time difference T(m) is formed between the second self-refresh command SF2 and the active command A(m).

Then, if the second time difference T(m) is less than the refresh cycle time of the memory chip 110, the second testing result is that the memory chip 110 is in the data failure state.

Furthermore, if the second time difference T(m) is greater than the refresh cycle time (tRFC) of the memory chip 110, the second testing result is that the memory chip 110 is in the data pass state.

In step 270, a self-refresh rate of the memory chip is calculated according to the first testing result and the second testing result. In some embodiments, please refer to FIG. 1 to FIG. 2, a self-refresh rate of the memory chip 110 is calculated according to the first testing result and the second testing result by the test equipment 120 of the testing system 100.

Figure 4A:
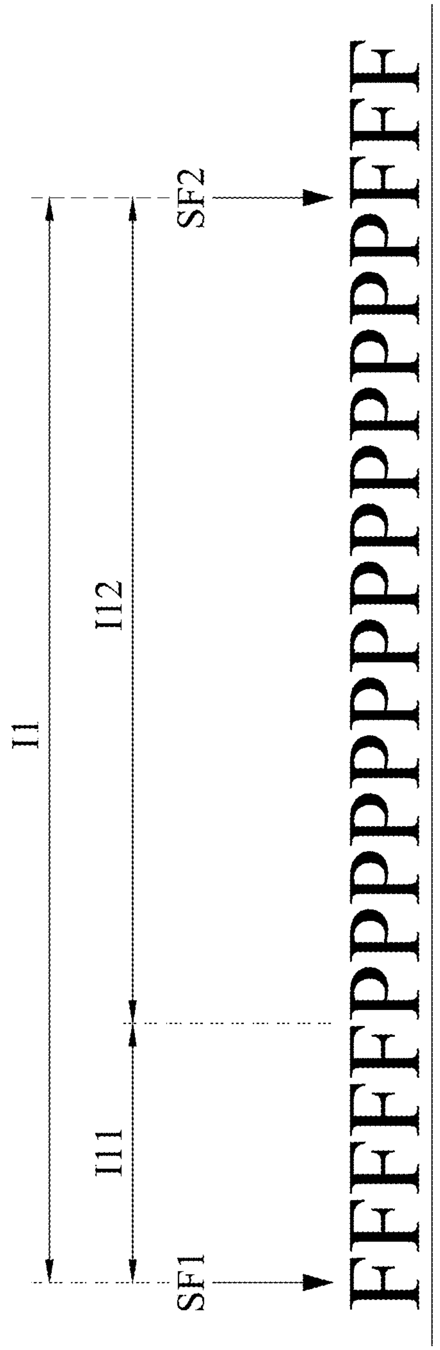
FIG. 4A depicts a schematic diagram of testing results timing in a high temperature range according to one embodiment of the present disclosure.

In some embodiments, please refer to FIG. 1, FIG. 2, and FIG. 4A. FIG. 4A depicts a schematic diagram of testing results timing in a high temperature range according to one embodiment of the present disclosure.

In some embodiments, a self-refresh period I1 is formed between the first self-refresh command SF1 and the second self-refresh command SF2. The self-refresh period I1 includes a first time interval I11 and a second time interval I12. The first time interval I11 is that the memory chip 110 is in the data failure state "F" in a high temperature range. The second time interval I12 is that the memory chip 110 is in the data pass state "P" in a high temperature range. In some embodiments, the high temperature range is between 70° C. and 80° C., or above 80° C.

In some embodiments, number of testing results is one thousand times. It should be noted that number of testing results is not limited to embodiment of figure.

In some embodiments, the test equipment 120 is further configured to calculate the self-refresh rate of the memory chip 110 according to the first time interval I11 and the second time interval I12 of the self-refresh period I1 in a low temperature range.

Figure 4B:
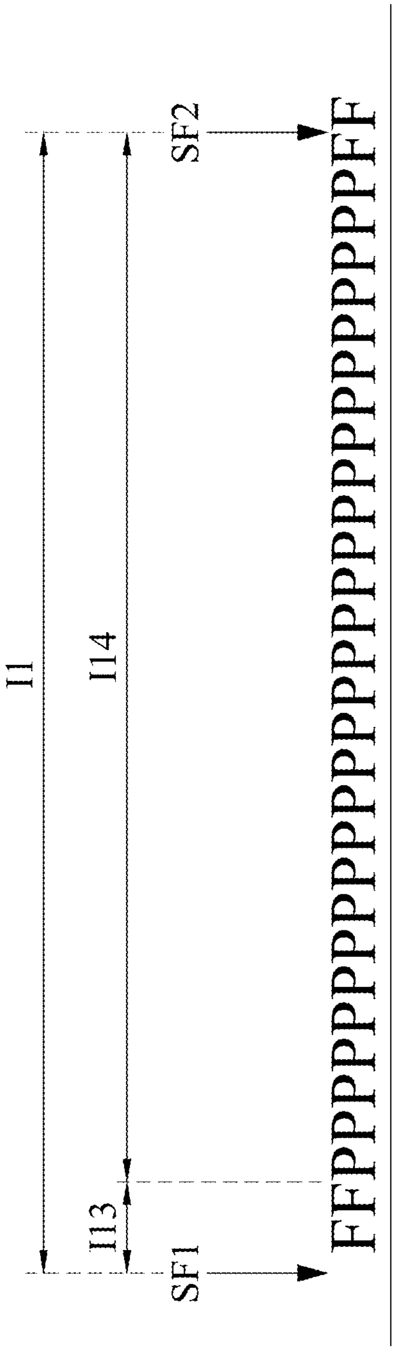
FIG. 4B depicts a schematic diagram of testing results timing in a low temperature range according to one embodiment of the present disclosure.

In some embodiments, please refer to FIG. 1, FIG. 2, and FIG. 4B. FIG. 4B depicts a schematic diagram of testing results timing in a low temperature range according to one embodiment of the present disclosure.

In some embodiments, a self-refresh period I1 is formed between the first self-refresh command SF1 and the second self-refresh command SF2. The self-refresh period I1 includes a third time interval I13 and a fourth time interval I14. The third time interval I13 is that the memory chip 110 is in the data failure state "F" in a low temperature range. The fourth time interval I14 is that the memory chip 110 is in the data pass state "P" in a low temperature range. In some embodiments, the lower temperature range is about −20° C., or a temperature that the memory chip 110 can withstand.

In some embodiments, number of testing results is one thousand times. It should be noted that number of testing results is not limited to embodiment of figure.

In some embodiments, the test equipment 120 is further configured to calculate the self-refresh rate of the memory chip 110 according to the third time interval I13 and the fourth time interval I14 of the self-refresh period I1 in a low temperature range.

Based on the above embodiments, the present disclosure provides a testing system and a testing method to calculate a self-refresh rate of a memory chip at any temperature range so as to reduce time cost.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A testing method, comprising:

entering a self-refresh mode respectively in each of a plurality of stages according to each of a plurality of self-refresh commands by a memory chip;

receiving a first clock enable signal and a first active command in response to a first level of the first clock enable signal to generate a first testing result at a first stage of the stages by the memory chip;

receiving each of a plurality of second clock enable signals and a second active command in response to the first level of each of the second clock enable signals respectively to generate a second testing result at each of second stages of the stages by the memory chip, wherein a duration time of a second level of the first clock enable signal is smaller than a duration time of the second level of each of the second clock enable signals, wherein each of the first testing result and the second testing results indicates a data state of the memory chip; and calculating a self-refresh rate according to the first testing result and the second testing results by an external system.

2. The testing method of claim 1, wherein the duration time of the second level of each of the second clock enable signals is different from each other.

3. The testing method of claim 1, further comprising:

adjusting the duration time of the second level of the first clock enable signal by the external system into the duration time of the second level of each of the second clock enable signals.

4. The testing method of claim 1, wherein the self-refresh commands comprises a first self-refresh command, wherein a first time difference is formed between the first self-refresh command and the first active command, the memory chip is further configured to:

determine whether the first time difference is less than a refresh cycle time of the memory chip to decide the data state of the memory chip at the first stage; and output the first testing result according to the data state of the memory chip.

5. The testing method of claim 4, wherein the self-refresh commands comprises a plurality of second self-refresh commands, wherein second time difference are formed between each of the second self-refresh commands and the second active command, the memory chip is further configured to:

determine whether the second time differences are less than the refresh cycle time of the memory chip to decide the data state of the memory chip each of the second stage respectively; and output each of the second testing results according to the data state of the memory chip respectively.

6. The testing method of claim 1, wherein the first level is at high level, and the second level is at low level.

7. The testing method of claim 1, wherein the external system is a test equipment.

8. The testing method of claim 1, wherein the self-refresh commands comprises a first self-refresh command, wherein an input time of the first self-refresh command is when the first clock enable signal is at the second level.

9. The testing method of claim 8, wherein the self-refresh commands comprises a plurality of second self-refresh commands, wherein an input time of each of the second self-refresh commands is when each of the second clock enable signals is at the second level.

10. A memory module under test, comprising:

a memory chip, coupled to an external system;

wherein the memory module under test is configured to execute operations:

entering a self-refresh mode respectively in each of a plurality of stages according to each of a plurality of self-refresh commands by the memory chip;

receiving a first clock enable signal and a first active command in response to a first level of the first clock enable signal to generate a first testing result at a first stage of the stages by the memory chip;

receiving each of a plurality of second clock enable signals and a second active command in response to the first level of each of the second clock enable signals respectively to generate a second testing result at each of second stages of the stages by the memory chip, wherein a duration time of a second level of the first clock enable signal is smaller than a duration time of the second level of each of the second clock enable signals, wherein each of the first testing result and the second testing results indicates a data state of the memory chip; and calculating a self-refresh rate according to the first testing result and the second testing results by the external system.

11. The memory module under test of claim 10, wherein the duration time of the second level of each of the second clock enable signals is different from each other.

12. The memory module under test of claim 11, wherein the external system is configured to execute operations:

adjusting the duration time of the second level of the first clock enable signal into the duration time of the second level of each of the second clock enable signals.

13. The memory module under test of claim 10, wherein the self-refresh commands comprises a first self-refresh command, wherein an input time of the first self-refresh command is when the first clock enable signal is at the second level.

14. The memory module under test of claim 13, wherein the self-refresh commands comprises a plurality of second self-refresh commands, wherein an input time of each of the second self-refresh commands is when each of the second clock enable signals is at the second level.

15. The memory module under test of claim 10, wherein the external system is a test equipment.

* * * * *